US006877144B1

(12) United States Patent
Rittman et al.

(10) Patent No.: US 6,877,144 B1
(45) Date of Patent: *Apr. 5, 2005

(54) SYSTEM AND METHOD FOR GENERATING A MASK LAYOUT FILE TO REDUCE POWER SUPPLY VOLTAGE FLUCTUATIONS IN AN INTEGRATED CIRCUIT

(75) Inventors: Danny Rittman, Sunnyvale, CA (US); Micha Oren, Cupertino, CA (US)

(73) Assignee: DuPont Photomasks, Inc., Round Rock, TX (US)

( * ) Notice: Subject to any disclaimer, the term of this patent is extended or adjusted under 35 U.S.C. 154(b) by 64 days.

This patent is subject to a terminal disclaimer.

(21) Appl. No.: 10/378,537

(22) Filed: Mar. 3, 2003

Related U.S. Application Data (63) Continuation-in-part of application No. 10/084,216, filed on Feb. 28, 2002, now abandoned.

(51) Int. Cl.[7] .................................................. G06F 17/50
(52) U.S. Cl. ............................... 716/10; 716/2; 716/5; 716/8; 716/9; 716/11
(58) Field of Search .......................... 716/2, 5, 8–14, 716/19–21

(56) References Cited

U.S. PATENT DOCUMENTS 6,446,016 B1   9/2002  Zhu ............................ 702/69
6,487,702 B2 * 11/2002  Lin et al. ....................... 716/4
6,523,159 B2 *  2/2003  Bernstein et al. ............. 716/10
6,618,843 B2 *  9/2003  Dansky et al. ................. 716/5
2002/0166109 A1 * 11/2002  Rittman et al. ............... 716/19
2004/0064800 A1 *  4/2004  Korobkov ..................... 716/10
2004/0073881 A1 *  4/2004  Nassif et al. .................. 716/10

OTHER PUBLICATIONS

U.S. Appl. No. 10/378,452 entitled "Photomask for Reducing Power Supply Voltage Fluctuations in an Integrated Circuit and Integrated Circuit Manufactured with the Same" filed by Rittman et al. on Mar. 3, 2003; 49 pages.

* cited by examiner

*Primary Examiner*—Vuthe Siek
(74) *Attorney, Agent, or Firm*—Baker Botts L.L.P.

(57) ABSTRACT

A system and method for generating a mask layout file to reduce power supply voltage fluctuations in an integrated circuit are disclosed. The method includes analyzing a pattern in a mask layout file to identify a region in the pattern to add one or more decoupling capacitors. Once the region is identified, a feature located in the identified region is moved based on a design rule from a first position to a second position in the mask layout file to create a space in the identified region. The decoupling capacitors are automatically placed in the space in the identified region.

26 Claims, 5 Drawing Sheets

SYSTEM AND METHOD FOR GENERATING A MASK LAYOUT FILE TO REDUCE POWER SUPPLY VOLTAGE FLUCTUATIONS IN AN INTEGRATED CIRCUIT

RELATED APPLICATIONS

This application is a continuation-in-part of U.S. patent application Ser. No. 10/084,216, filed Feb. 28, 2002 and entitled "AUTOMATIC PLACEMENT AND CONNECTION OF DECOUPLING CAPACITORS THROUGHOUT MASK LAYOUT DATABASE (IC LAYOUT), ACCORDING TO PROCESS DESIGN RULES AND SCHEMATIC CONNECTIVITY, METHOD AND COMPUTER SOFTWARE now abandoned."

TECHNICAL FIELD OF THE INVENTION

This invention relates in general to the field of semiconductor design, and more particularly to a system and method for generating a mask layout file to reduce power supply voltage fluctuations in an integrated circuit.

BACKGROUND OF THE INVENTION

A typical semiconductor design process includes numerous steps. Initially, a circuit designer prepares a schematic diagram that includes logical connections between logic elements that form an integrated circuit. The schematic diagram is then tested to verify that the logic elements and associated logical connections perform a desired function. Once the circuit is verified, the schematic diagram is converted into a mask layout database that includes a pattern of polygons. The polygons may represent the logic elements and the logical connections contained the schematic diagram. The mask layout database is then converted into multiple photomasks, also know as masks or reticles, that may be used to image different layers of the integrated circuit on to a semiconductor wafer.

Over the past several years, the number of transistors that form an integrated circuit has increased dramatically. Additionally, the operating speed of integrated circuits has also increased. High-speed integrated circuits require a stable voltage, regardless of the input current required. However, spike currents generated during switching can cause power (VCC) and ground (GND) voltage levels to fluctuate, which may cause ringing in the output waveform or a delay in response speed. The spike currents, also known as switching noise, are caused by changes in current through various parasitic inductances. The simultaneous switching of the input/output drivers and internal circuits can increase the voltage drop on the power supply. This power supply noise not only will introduce additional signal delay, but also may cause false switching of logic gates. Typically, decoupling capacitors may be used to reduce the impedance between power and ground, which minimizes the effects of current spikes and board noise on the IC, keeps the power supply within specification, and provides signal integrity for the IC.

The decoupling capacitors may be placed in a mask layout database manually by a layout designer using schematics to determine a location for the capacitors or automatically by a synthesis tool using a netlist associated with the schematics. The selected locations of the decoupling capacitors in the mask layout database, however, may not be optimal and thus, the use of space in the mask layout database may be inefficient. Furthermore, the decoupling capacitors may need to be manually connected to the power and ground signals by the layout designer. During the routing process, the layout designer may need to move polygons in order to provide a connection from the decoupling capacitor to the power supply. The layout designer may inadvertently create design rule violations or connectivity errors. The layout designer may then have to correct the violations and errors until the mask layout database is clean. The process of iteratively correcting the design rule violations may take several hours or even days to complete and can increase the time needed to design the integrated circuit. The additional time required to complete layout may also delay the production of a photomask set used to fabricate the integrated circuit.

SUMMARY OF THE INVENTION

In accordance with the present invention, the disadvantages and problems associated with generating a mask layout file to reduce power supply voltage fluctuations in an integrated circuit have been substantially reduced or eliminated. In a particular embodiment, a method for generating a mask layout file to reduce power supply voltage fluctuations in an integrated circuit includes moving a feature located in an identified region based on a design rule from a first position to a second position in a mask layout file to create a space in the identified region and automatically placing one or more decoupling capacitors in the space.

In accordance with one embodiment of the present invention, a method for generating a mask layout file to reduce power supply voltage fluctuations in an integrated circuit includes analyzing a pattern in a mask layout file to identify a region in the pattern to add one or more decoupling capacitors. Once the region has been identified, a feature located in the identified region is moved based on a design rule from a first position to a second position in the mask layout file to create a space in the identified region. The decoupling capacitors are automatically placed in the space created in the identified region.

In accordance with another embodiment of the present invention, a computer system for generating a mask layout file to reduce power supply voltage fluctuations in an integrated circuit includes a processing resource coupled to a computer readable memory. Processing instructions are encoded in the computer readable memory. The instructions are executed by the processing resource to analyze a pattern in a mask layout file to identify a region in the pattern to add one or more decoupling capacitors. Once the region has been identified, the processing instructions move a feature located in the identified region based on a design rule from a first position to a second position in the mask layout file to create a space in the identified region. The processing instructions place the decoupling capacitors in the space created in the identified region.

Important technical advantages of certain embodiments of the present invention include a placement tool that automatically connects decoupling capacitors added in a mask layout file to a power supply node. The placement tool analyzes the mask layout file to identify valid or empty regions to place the decoupling capacitors. Before placing the decoupling capacitors, the placement tool determines if a connection may be established from the decoupling capacitors to the power supply. If the connection may be established, the placement tool automatically moves any features to create a routing path for the connection and simultaneously eliminates or prevents design rule violations and/or connectivity errors from being created.

Another important technical advantage of certain embodiments of the present invention includes a placement tool that reduces the amount of time required to design and manufacture a semiconductor device. During placement of the capacitors in a mask layout file, the placement tool invokes a design rule fix (DRF) tool and a layout versus schematic (LVS) tool to respectively correct and prevent design rule violations and connectivity errors. Since the placement and correction processes occur together, the mask layout file may be free of design rule violations in a shorter amount of time, which reduces the cycle time for manufacturing a photomask used to fabricate the semiconductor device.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention and their advantages are best understood by reference to FIGS. 1 through 6, where like numbers are used to indicate like and corresponding parts.

As the number of transistors on an integrated circuit (IC) continues to increase, the design process for the IC becomes more complex. For example, an increasing number of transistors may require additional layers to form the IC on a semiconductor wafer. Each layer associated with the IC may include one or more design rules for the individual layer in a desired manufacturing process. The number of design rules for the desired manufacturing process, therefore, increases with the number of layers formed on the semiconductor wafer.

A design rule typically defines the minimum or maximum allowable dimension for a feature fabricated on a specific layer. For example, an IC may include, among other layers, a diffusion layer that forms a decoupling capacitor and/or the source and drain regions of a transistor, a polysilicon layer that forms the gate of the transistor, a metal layer that forms interconnects between transistors and a contact or via layer that connects one layer to another layer (e.g., a contact layer that connects the polysilicon layer to the metal layer). Each layer typically has one or more design rules associated with features in a mask layout file that are formed on the specific layer. The design rules for a metal layer may include, but are not limited to, a minimum allowable spacing between two adjacent metal features, a minimum width of a metal feature and a minimum and/or maximum length of a metal feature. The polysilicon and contact layers may include similar design rules where the minimum or maximum allowable dimensions are unique to that layer.

Figure 1:
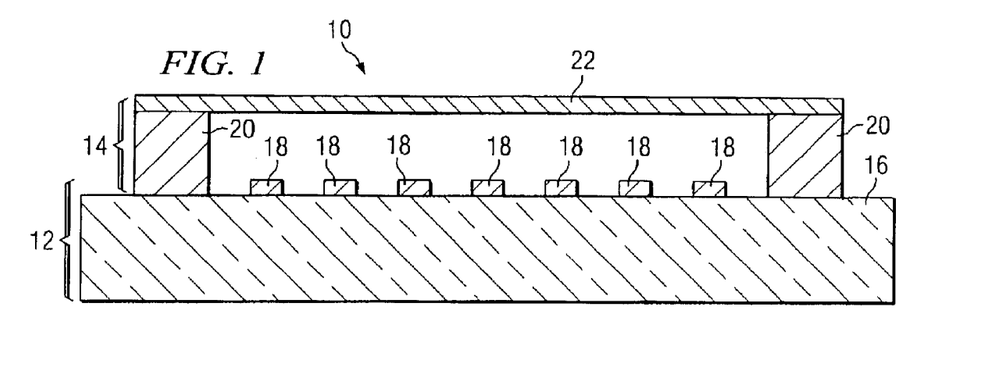
FIG. 1 illustrates a cross-sectional view of a photomask assembly manufactured in accordance with teachings of the present invention.

FIG. 1 illustrates a cross-sectional view of photomask assembly 10 manufactured using a mask layout file. Photomask assembly 10 includes photomask 12 coupled to pellicle assembly 14. Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a onetime master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correction (OPC) mask or any other type of mask suitable for use in a lithography system.

Photomask 12 includes patterned layer 18 formed on substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Patterned layer 18 may be a metal material such as chrome, chromium nitride, a metallic oxy-carbo-nitride (M-O-C-N), where the metal is selected from the group consisting of chromium, cobalt, iron, zinc, molybdenum, niobium, tantalum, titanium, tungsten, aluminum, magnesium and silicon, and any other suitable material that absorbs electromagnetic energy with wavelengths in the ultraviolet (UV) range, deep ultraviolet (DUV) range, vacuum ultraviolet (VUV) range and extreme ultraviolet range (EUV). In an alternative embodiment, patterned layer 18 may be a partially transmissive material, such as molybdenum silicide (MoSi), which has a transmissivity of approximately one percent (1%) to approximately thirty percent (30%) in the UV, DUV, VUV and EUV ranges.

Frame 20 and pellicle film 22 may form pellicle assembly 14. Frame 20 is typically formed of anodized aluminum, although it could alternatively be formed of stainless steel, plastic or other suitable materials. Pellicle film 22 may be a thin film membrane formed of a material such as nitrocellulose, cellulose acetate, an amorphous fluoropolymer, such as TEFLON® AF manufactured by E. I. du Pont de Nemours and Company or CYTOP® manufactured by Asahi Glass, or another suitable film that is transparent to wavelengths in the UV, DUV, EUV and VUV ranges. Pellicle film 22 may be prepared by a conventional technique such as spin casting.

Pellicle film 22 protects photomask 12 from contaminants, such as dust particles, by ensuring that the contaminants remain a defined distance away from photomask 12. This may be especially important in a lithography system. During a lithography process, photomask assembly 10 is exposed to electromagnetic energy produced by a radiant energy source within the photolithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Dust particles collected on pellicle film 22 will likely be out of focus at the surface of the wafer being processed and, therefore, the exposed image on the wafer should be clear. Pellicle film 22 formed in accordance with the teachings of the present invention may be satisfactorily used with all types of electromagnetic energy and is not limited to lightwaves as described in this application.

Photomask 12 may be formed from a photomask blank using standard lithography processes. In a lithography process, a mask pattern file that includes data for patterned layer 18 may be generated from a mask layout file. The mask layout file may include features that represent transistors and electrical connections for an integrated circuit. The features in the mask layout file may further represent different layers of the integrated circuit when it is fabricated on a semiconductor wafer. For example, a transistor may be formed on a semiconductor wafer from a diffusion layer and a polysilicon layer. The mask layout file, therefore, may include one or more features drawn on the diffusion layer and one or more features drawn on the polysilicon layer. The features for each layer may be converted into a mask pattern file that represents one layer of the integrated circuit. Each mask pattern file may be used to generate a photomask for the specific layer.

A common problem in integrated circuits occurs when multiple transistors in the integrated circuit switch at the same time. The change in current created when the transistors switch state can result in a significant voltage drop across the power lines of a chip (e.g., dI/dt noise). Reducing noise is especially important for high-frequency circuits since excessive noise increases demands on noise margin and other circuit parameters.

The switching noise may be reduced by protecting the power supply voltage from fluctuations through the addition of decoupling capacitors to the mask layout file. In one embodiment, the mask layout file may be analyzed to calculate a total area that should be occupied by decoupling capacitors to prevent any fluctuations in the power supply. If the decoupling capacitors cannot be placed in a continuous group, the mask layout file may be analyzed to identify multiple locations in the mask layout file where the decoupling capacitors may be placed. The sum of the areas represented by the multiple identified regions may be approximately equal to the total area calculated.

Once a valid region in the mask file is identified, the nearest power supply features (e.g., power and ground) are located to determine if a connection may be created between the decoupling capacitors and the power supply features. If no path is available, a new region is identified. If the connection may be created, the region is analyzed to determine if any features (e.g., a device, a contact or an interconnect feature) should be moved to create the connection. The features may be repositioned within the identified region or moved outside of the region to create a empty space for the decoupling capacitors. The features may be repositioned using a compaction algorithm in combination with a design rule fix (DRF) tool and a layout versus schematic (LVS) tool. The DRF tool checks the features at the new positions to determine if any design rule violations were created and automatically prevents and/or corrects any design rule violations. The LVS tool ensures that moving the features does not cause any connectivity errors. If any connectivity errors are created, the LVS tool automatically corrects them to provide the appropriate connectivity.

Once any features have been repositioned, the decoupling capacitors may be placed in the empty space in the identified region. The decoupling capacitors may be automatically connected to the nearest power supply features according to the schematic netlist associated with the integrated circuit. Again, the DRF and LVS tools may be used to respectively correct any design rule violations and connectivity violations created when the decoupling capacitors are added and the connections from the decoupling capacitors to the appropriate nodes are generated. Since all additions and checks are performed automatically, the mask layout file may be generated in a reduced amount of time.

The mask layout file may then be converted into multiple mask pattern files that represent the various layers of the integrated circuit. The desired pattern from the mask pattern file may be imaged into a resist layer of the photomask blank using a laser, electron beam or X-ray lithography tool. In one embodiment, a laser lithography tool uses an Argon-Ion laser that emits light having a wavelength of approximately 364 nanometers (nm). In alternative embodiments, the laser lithography tool uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over substrate 16.

Photomask 12 may then be placed into a lithography system to project an image onto the surface of a semiconductor wafer. A separate photomask is used for each individual layer of the integrated circuit. For example, one photomask may be used to create the diffusion regions on a wafer and another photomask may be used to create a layer of polysilicon over the diffusion regions. Each layer of the integrated circuit on the semiconductor wafer may be fabricated by imaging the pattern from photomask 12 into a resist layer, developing and etching exposed areas of the resist layer, etching the portions of the under lying material (e.g., diffusion, polysilicon, or metal) and removing the undeveloped resist. Each layer of the integrated circuit formed on the semiconductor wafer may be separated by a layer of insulating material.

Figure 2:
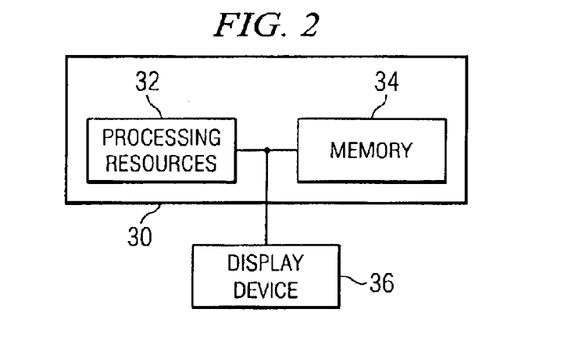
FIG. 2 illustrates a block diagram of a computer system for generating a mask layout file in accordance with teachings of the present invention.

FIG. 2 illustrates a block diagram of computer system 30 used to generate a mask layout file by automatically placing decoupling capacitors in a pattern in the mask layout file. In the illustrated embodiment, computer system 30 includes processing resource 32, memory 34 and display device 36. Processing resource 32 may be a microprocessor, a microcontroller, a digital signal processor (DSP) or any other digital or analog circuitry configured to execute processing instructions stored in memory 34. Memory 34 may be random access memory (RAM), electrically erasable programmable read-only memory (EEPROM), a PCMCIA card, flash memory, or any suitable selection and/or array of volatile or non-volatile memory that retains data after the power to computer system 30 is turned off. Display device 36 may be a liquid crystal device, cathode ray tube, or other display device suitable for creating graphic images and alphanumeric characters recognizable to a user.

In operation, processing instructions are stored in memory 34. Processing resource 32 accesses memory 34 to retrieve the processing instructions and perform various functions included in the processing instructions. In one embodiment, the processing instructions may include a placement tool, a design rule fix (DRF) tool and a layout versus schematic (LVS) tool. The placement tool may add and connect decoupling capacitors in a mask layout file. The DRF tool may eliminate existing design rule violations and prevent violations from being created during the placement of the decoupling capacitors. The LVS tool may correct any existing connectivity errors and prevent other errors from being created when the decoupling capacitors are connected in the mask layout file.

The placement tool may analyze the pattern included in the mask layout file and calculate a total area in the pattern to place decoupling capacitors. In one embodiment, the total area may be located in one contiguous block in the mask layout file. In another embodiment, the total area may be subdivided into multiple regions that are distributed at unique positions throughout the mask layout file.

Once the placement tool has identified a region to place the decoupling capacitors, the placement tool attempts to locate a power supply node near the identified region. In one embodiment, the nearest power supply node may be a local node located within the identified region. The local node may be provided on any metal layer below the layer used to form the power grid for the IC. In another embodiment, the nearest power supply feature may be the power grid, which may be formed on the top layer of metal (e.g., the metal eight layer in a mask layout file that includes eight layers of metal). In an additional embodiment, the placement tool may determine that a power supply node cannot be reached from the identified region. The placement tool continues to search for valid regions in the mask layout file until a nearby power supply node can be located to provide a connection to the decoupling capacitors added in the identified region. If the placement tool cannot find a valid region, the placement tool may generate an output file indicating that an attempt to place a decoupling capacitor was unsuccessful.

If the placement tool determines that a connection to the power supply may be provided, the placement tool determines if any features in the identified region should be moved to accommodate placement of the decoupling capacitors. The placement tool then moves the features to appropriate locations either inside or outside of the identified region. The placement tool may move the features without creating any design rule violations by using the DRF tool and may maintain the connectivity by using the LVS tool.

In one embodiment, the placement tool may determine that the pattern can be compacted in order to move the features in the identified region and create a space for the decoupling capacitors. The placement tool first compares the spacing between the polygons in the mask layout file to the corresponding design rule in the technology file. If any of the spacings are greater than the corresponding design rules, the placement tool attempts to reduce the distance between the polygons such that the spacing between the polygons is approximately equal to the corresponding minimum feature spacing contained in the technology file. During compaction, the placement tool may invoke the DRF tool to access the design rules for compacting the mask layout file and to prevent design rule violations from being created.

The DRF tool may eliminate and prevent design rule violations during placement of the decoupling capacitors by using any commercially available design rule check (DRC) tool to compare feature dimensions in a mask layout file with design rules for a desired manufacturing process. The design rules may be included in a technology file that is used by the DRC tool and may represent the minimum and/or maximum allowable feature dimensions (e.g., spaces between features and dimensions of features) for the desired manufacturing process. If the feature dimensions in the mask layout file are greater than or equal to the minimum design rules, the DRC tool may generate an output file indicating that the mask layout file does not include any design rule violations.

If the DRC tool determines that at least one feature dimension in the mask layout file is less than a corresponding design rule in the technology file, the DRC tool may generate an output file that contains any identified design rule violations. The output file may be used by the DRF tool to locate the coordinates of the features in the mask layout file that are associated with the design rule violations. The DRF tool may automatically adjust the feature dimension of spaces between features or the length and/or width of the features until the feature dimension is approximately equal to or greater than the corresponding design rule in the technology file.

In one embodiment, changes to the mask layout file may create new design rule violations that are associated with features surrounding the edited features. The DRF tool, therefore, analyzes any changes to the mask layout file to ensure that no additional design rule violations are created. Once the DRF tool determines that the changes to the mask layout file do not create additional design rule violations, the DRF tool repositions the features associated with the original design rule violations. In one embodiment, the DRF tool may reposition one or more edges of the features in the mask layout file. The DRF tool also maintains connectivity in the mask layout file by adding features to and/or subtracting features from any connections that may be affected when the features associated with the design rule violation are repositioned in the mask layout file. The DRF tool individually locates and corrects all of the design rule violations identified in the output file until the mask layout file is free of design rule violations.

The placement tool may also invoke the LVS tool to prevent connectivity errors and maintain the correct connections when moving the features in the identified region to create space for the decoupling capacitors. The LVS tool may compare logical connections contained in a netlist generated from a schematic diagram of an integrated circuit with electrical connections contained in a mask layout file generated from the corresponding layout block for the integrated circuit. If the electrical connections in the mask layout file match the logical connections in the netlist, the LVS tool may generate an output file that indicates the mask layout file does not include any connectivity errors.

However, if at least one electrical connection in the mask layout file does not match the corresponding logical connection in the netlist, the LVS tool may generate an output file that contains any connectivity errors identified by the LVS tool in the mask layout file. This output file is then used to locate the electrical connections in mask layout file that do not match the corresponding logical connections in the netlist. The LVS tool automatically deletes the mismatched connections. In one embodiment, the LVS tool removes all of the features associated with the mismatched connection. In another embodiment, the LVS tool creates a break point in the mismatched connections and removes the features between the break point and the mismatched node.

In one embodiment, the LVS tool may use the output file to locate nodes in the mask layout file that correspond to the nodes in the netlist. The LVS tool may match the nodes in the mask layout file to the nodes in the netlist and generate electrical connections that match the logical connections. The LVS tool then automatically routes the electrical connections between the appropriate nodes. The electrical connections are routed though the mask layout file without creating any design rule violations in the mask layout file. The process is performed on all mismatched connections and all connectivity errors are removed from the mask layout file.

Once the features in the identified region have been moved and the DRF and LVS tools have verified that no design rule violations exist and the connectivity is correct, the placement tool adds one or more decoupling capacitors in the space created in the identified regions. The number of decoupling capacitors may depend on the amount of space in the mask layout file that the placement tool can make available. The placement tool then connects the decoupling capacitors to a power supply node. In one embodiment, the power supply nodes may be local nodes formed from features on a metal layer below a top metal layer. The placement tool may create a connection from the decoupling capacitors to the power supply nodes by adding features representing the layers between the decoupling capacitor layer and the layer for the local power supply nodes. In another embodiment, the placement tool may not be able to route a connection to a local power supply node. The placement tool may then create a connection from the decoupling capacitors to the power grid, which may be located on the top or final layer of metal. The placement tool may create a connection to the power grid by adding features between the decoupling capacitor layer and the final metal layer. During the routing process, the placement tool may use the DRF and LVS tools to ensure that no design rule violations or connectivity errors are introduced when the decoupling capacitors are placed in the mask layout file.

In some embodiments, the processing instructions for correcting design rule violations in a mask layout file may be encoded in computer-usable media. Such computer-usable media may include, without limitation, storage media such as floppy disks, optical disks, hard disks, CD-ROMs, DVDS, read-only memory, random access memory and magnetic or optical cards; as well as communications media such wires, optical fibers, microwaves, radio waves, and other electromagnetic or optical carriers.

Figure 3:
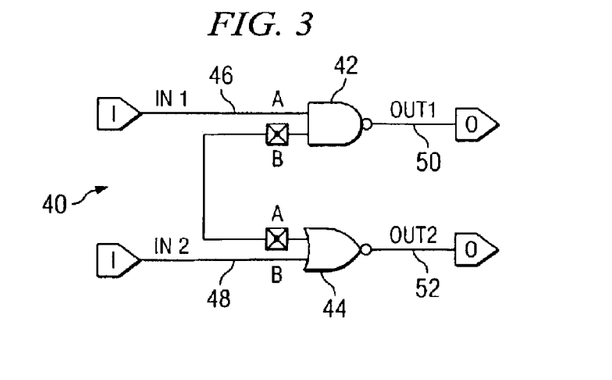
FIG. 3 illustrates a schematic diagram of an example integrated circuit formed in accordance with teachings of the present invention.

FIG. 3 illustrates schematic diagram 40 of an integrated circuit that includes NAND 42 and NOR 44. NAND 42 may include two inputs, labeled a and b and NOR 44 may include two inputs, labeled a and b. In the illustrated embodiment, node 46, labeled in1, is connected to input a of NAND 42, node 48, labeled in2, is connected to input b of NOR 44, and input b of NAND 42 is connected to input a of NOR 44. Output 50 of NAND 42 is labeled out1 and output 52 of NOR 44 is labeled out2. In another embodiment, NAND 42 and NOR 44 may have more than two inputs and the circuit may be connected in any suitable way. In other embodiments, an integrated circuit may include other logical elements, including, but not limited to, inverters, AND gates, OR gates, XOR gates and XNOR gates, and complex circuits, such as adders, latches, flip-flops, multiplexers, registers, memory cells, programmable logic arrays (PLAs) and any other type of circuitry that may be used to form an integrated circuit.

In order to verify that the logic elements and associated connections perform the desired function, a netlist may be generated of the integrated circuit in schematic diagram 40. The netlist may include a list of transistors, such as P-MOSFETS and N-MOSFETS that form the integrated circuit, nodes associated with the integrated circuit (e.g., nodes 46 and 48 and outputs 50 and 52 and any connections to power and ground) and the logical connections between the nodes. A verification tool may be used to verify that the connections are correct and the verified netlist may be stored in memory 34 for use by other applications.

Figure 4:
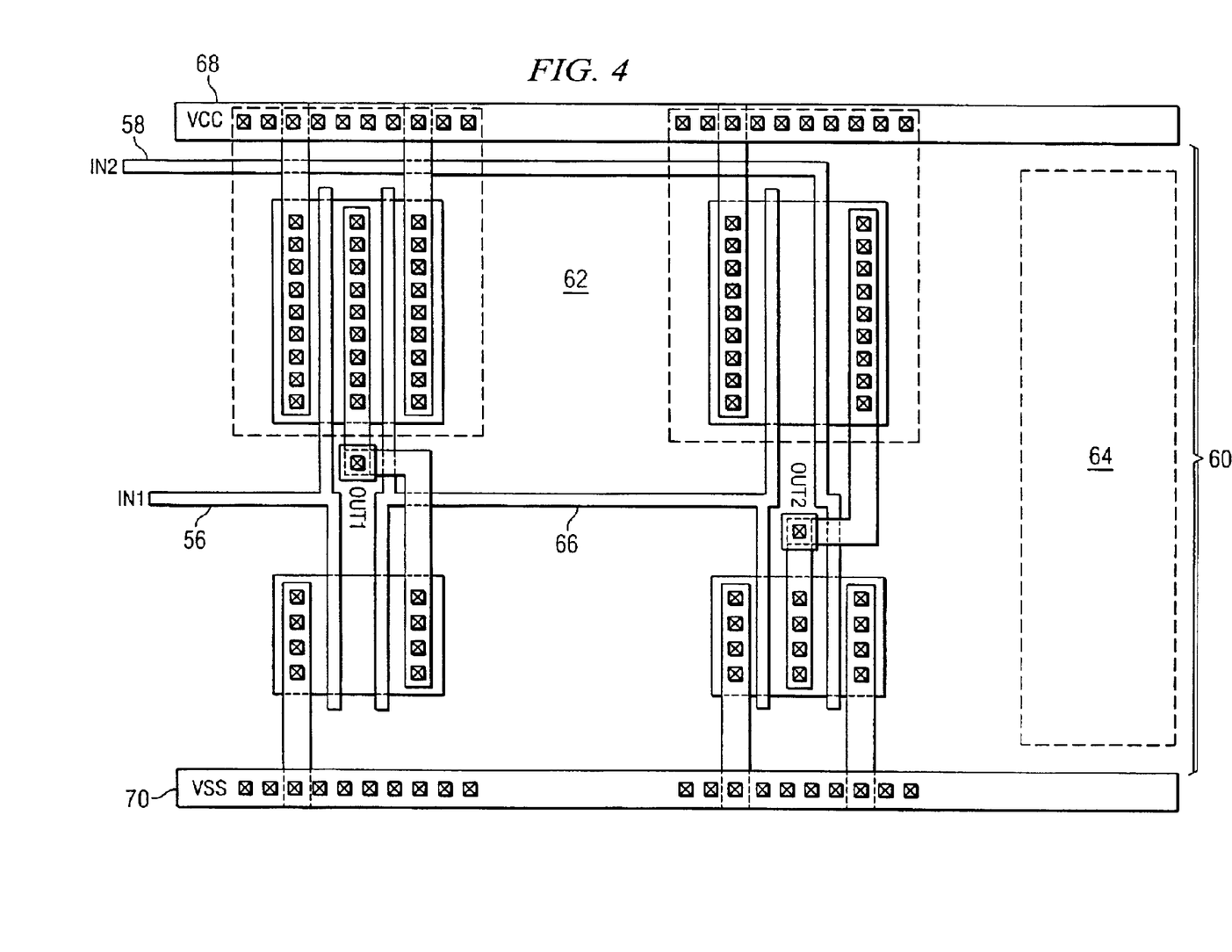
FIG. 4 illustrates a layout view of the example integrated circuit of FIG. 3 formed in accordance with teachings of the present invention.

FIG. 4 illustrates layout block 54 that represents the integrated circuit shown in schematic diagram 40 of FIG. 3. Layout block 54 includes polygons that form NAND 42 and NOR 44. Node 56 corresponds to node 46 in schematic diagram 40 and node 58 corresponds to node 48 in schematic diagram 40. The integrated circuit may be represented by polygons drawn on different layers, including but not limited to, n-well, p-well, diffusion, polysilicon, metal one, contacts, metal one, metal two contacts, and metal two. In another embodiment, the integrated circuit may include the layers shown in FIG. 4 in addition to one or more polysilicon layers, one or more metal layers and any corresponding contact layers. On the fabricated IC, each layer may be separated by an insulating material, such as silicon dioxide.

A mask layout file may be generated from layout block 54 and checked for design rule violations by a DRF tool that interfaces with any commercially available DRC tool. The DRC tool may measure dimensions of features and spaces between features in the mask layout file to determine if any feature dimensions are less than minimum design rules for a desired manufacturing process. In one embodiment, the DRC tool may measure the space between features by determining the distance between the edges of two or more features. In another embodiment, the DRC tool may measure the dimensions of a feature by determining the distance between opposite edges of the feature. The DRC tool may then generate an output file indicating that layout block 54 is either free of design rule violations or has design rule violations associated with certain polygons. The output file may be used by a computer aided design. (CAD) tool executing on computer system 30 to display the location of any violations within layout block 54 to a user on display device 36.

The mask layout file may further be checked for connectivity errors by an LVS tool. The LVS tool compares electrical connections in the mask layout file with logical connections in the netlist generated from schematic diagram 40. The LVS tool may generate an output file indicating that layout block 54 is either free of connectivity errors or has connectivity errors. The output file may be used by a computer aided design (CAD) tool executing on computer system 30 to display the location of any errors within layout block 54 to a user on display device 36.

The mask layout file may also be analyzed by a placement tool to determine a total area that should be occupied by decoupling capacitors in order to prevent fluctuations in the power supply. As illustrated in FIG. 4, layout block 54 may contain regions 60 and 62 where the placement tool determines that decoupling capacitors may be placed. Region 60 may include space 64 to place a decoupling capacitor and region 62 may include polygon 66 that may be moved to another position in layout block 54 in order to make more space available to place additional decoupling capacitors. The illustrated embodiment further includes local power, VCC 68, and local ground, VSS 70.

Figure 5:
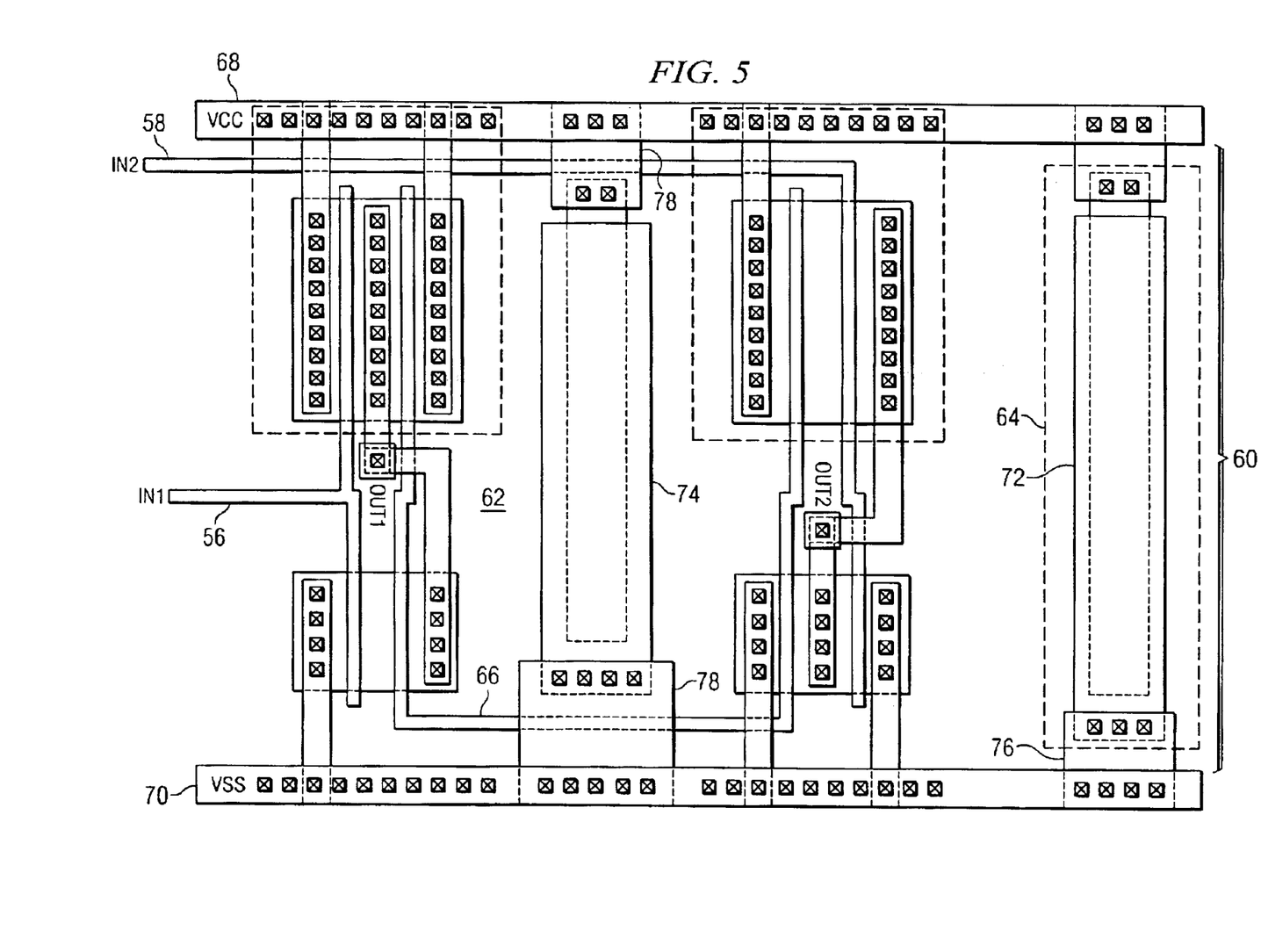
FIG. 5 illustrates a layout view of the example integrated circuit of FIG. 3 after placement of decoupling capacitors in a mask layout file.

FIG. 5 illustrates layout block 54 after the placement tool has added decoupling capacitors to a mask layout file. Once the placement tool identifies regions 60 and 62, capacitors 72 and 74 may be placed in empty spaces within regions 60 and 62. In one embodiment, the placement tool may select capacitors 72 and 74 from a standard cell library. The library may include numerous different sizes of decoupling capacitors. In another embodiment, the placement tool may automatically size capacitors 72 and 74 based on the space available in regions 60 and 62. In the illustrated embodiment, capacitor 72 occupies an area less than the size of space 64. In another embodiment, capacitor 72 may fill space 62.

In the illustrated embodiment, space 64 does not include any polygons to be moved by the placement tool and capacitor 72 may be placed directly in space 64. In order to place capacitor 74 in region 62, the placement tool may move polygon 66 to create additional space. During placement of capacitor 74, the placement tool may use a compaction algorithm to reduce the sizes of the polygons in mask layout block 54 and the spaces between the polygons such that the dimensions of the polygons and spaces between the polygons are approximately equal to the corresponding minimum design rules. The placement tool may also invoke a DRF and/or LVS tool to ensure that moving feature 66 does not create a design rule violation or disrupt the connectivity associated with polygon 66. In one embodiment, the placement tool may select regions 60 and 62 for respectively placing capacitors 72 and 74 by reading a netlist associated with layout block 54. The netlist may include capacitors 72 and 74 and indicate that capacitors 72 and 74 should be placed within regions 60 and 62. In another embodiment, the placement tool may analyze the mask layout file and determine that capacitors 72 and 74 may be placed in regions 60 and 62. The placement tool then generates an output file indicating where capacitors 72 and 74 were placed in mask layout block 54. The output file may be used by a circuit designer to manually add capacitors 72 and 74 to the corresponding schematics or by a synthesis tool to automatically update the schematics.

Once capacitors 72 and 74 are added to the mask layout file, the placement tool connects capacitors 72 and 74 to VCC 68 and VSS 70 by creating electrical connections 76 and 78. In the illustrated embodiment, VCC 68 and VSS 70 may be local versions of the respective power and ground signals for the integrated circuit. Since local signals are available, the placement tool may create electrical connections 76 and 78 to VCC 68 and VSS 70. During routing, the placement tool may further move polygon 66 to place electrical connection 78. The placement tool may use the DRF tool and the LVS tool to ensure that the mask layout file is free of design rule violations and all of the electrical connections between various nodes are maintained.

In one embodiment, layout block 54 may be a subcell in a hierarchical design and may be repeated multiple times in a top-level cell. In this example, the placement tool may identify regions 60 and 62 in one instance of the subcell. Since each instance of the subcell may include identical polygons, a change to the polygons in one subcell may affect all instances of the subcell. The placement tool, therefore, may add capacitors 72 and 74 in the one subcell and all other instances may be globally changed throughout the mask layout file. Once the: capacitors 72 and 74 are added in the subcells, the placement tool may check a top-level structure to determine if the changes caused any violations in the top-level structure or if any decoupling capacitors should be added to the top-level structure. If the DRF tool identifies any violations in the top-level structure, the DRF tool corrects the violations at the top-level and then verifies that the corrections did not effect any of the subcells. If the placement tool determines that decoupling capacitors should be added to the top-level structure, the placement tool places the appropriate decoupling capacitors and uses the DRF and LVS tools to respectively determine if the additional decoupling capacitors caused any design rule violations or connectivity errors in the subcells.

Figure 6A:
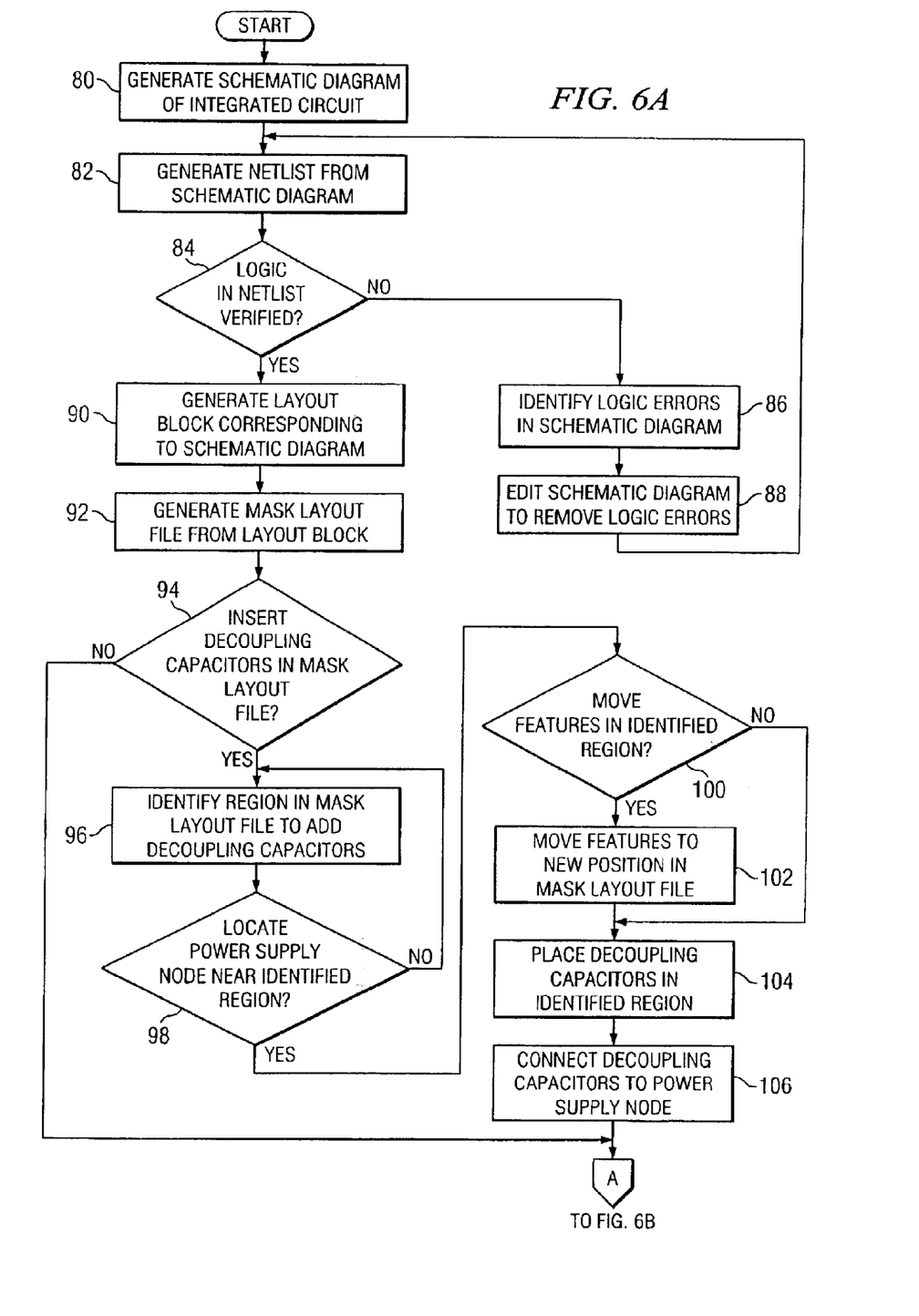
FIGS. 6A and 6B illustrate a flow chart for one example of a method for generating a mask layout file to reduce power supply voltage fluctuations in an integrated circuit in accordance with teachings of the present invention.
Figure 6B:
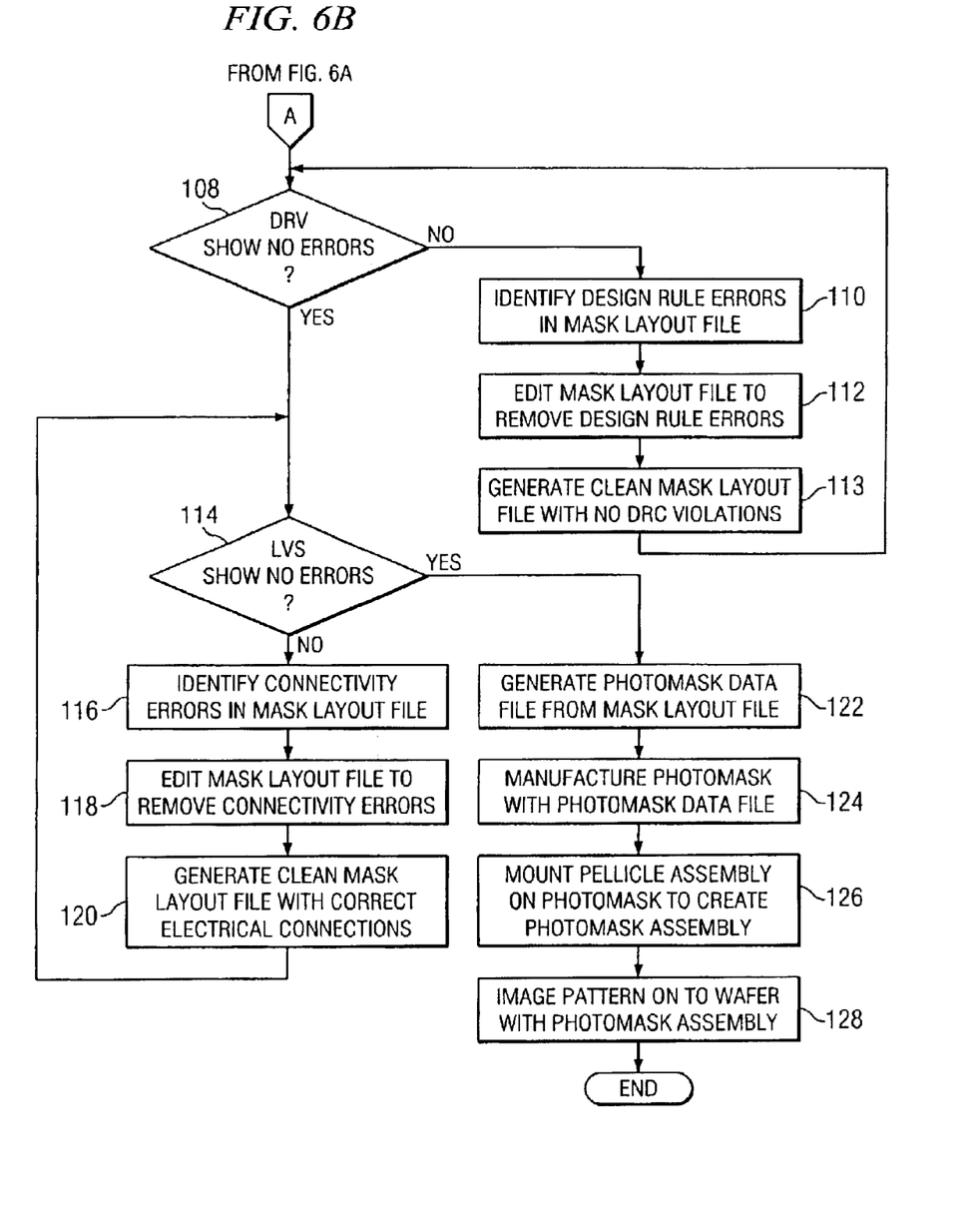

FIGS. 6A and 6B illustrate a flow chart of a method for generating a mask layout file to reduce power supply voltage-fluctuations in an integrated circuit. Generally, a mask layout file including a pattern that represents a circuit image is analyzed to calculate a total area of the pattern that should be occupied by decoupling capacitors. A placement tool identifies regions in the pattern that can accommodate the decoupling capacitors. The placement tool then analyzes each identified region to determine if features in the region should be moved to a new position in order to make room for the decoupling capacitors. Once space has been created for the decoupling capacitors, the placement tool automatically adds the decoupling capacitors to the mask layout file and connects the capacitors to the appropriate power supply nodes. The placement tool also accesses a design rule fix (DRF) tool and a layout versus schematic (LVS) tool to ensure that the added capacitors do not create any design rule violations and that the connectivity of the electrical connections in the pattern is maintained.

As illustrated in FIG. 6A, a circuit designer creates schematic diagram 40 for an integrated circuit at step 80. Schematic diagram 40 may be generated manually by the circuit designer or with a synthesis tool that creates a schematic diagram by using an input file, such as a high-level design language (HDL) file. The HDL file may include both behavioral descriptions and structural descriptions for the integrated circuit. Once schematic diagram 40 is complete, a netlist may be generated from schematic diagram 40 at step 82. The netlist may include definitions of the generic cell logic functions and the connections between the various logic functions. In one embodiment, the netlist may be a flat netlist that defines all of the logic and connections at one level. In another embodiment the netlist may be a hierarchical netlist that contains top-level cells and one or more sub-cells that can be used in any of the top-level cells. The netlist may be generated from CAD tools developed by Cadence, Synopsis, Mentor Graphics or any other company that provides software and/or hardware for generating a netlist from a schematic diagram.

At step 84, the netlist may be tested by a verification tool to determine if schematic diagram 40 includes the correct circuits and logical connections to perform a desired function. If the netlist contains logic errors, the verification tool may generate an output file that contains a list of the logic errors at step 86. The output file may be used to correct errors in the logic and/or errors in the connections between the logic in schematic diagram 40 at step 88. The corrections may be made manually by the circuit designer or the output file may be used by a synthesis tool to automatically correct the errors and insert the correct logical elements and/or connections. Once the corrections have been made, a clean netlist is generated for logic verification at step 82.

If the verification tool determines that the netlist does not contain any logic errors, layout block 54 that represents the integrated circuit shown in schematic diagram 40 is created at step 90. The layout block may be created manually by a layout designer using CAD tools developed by Cadence, Synopsis, Mentor Graphics, or any other company that develops integrated circuit layout tools, or automatically by a synthesis tool. Layout block 54 may include polygons located on different layers that form the transistors and electrical connections for the integrated circuit. The layers in layout block 54 may include, but are not limited to, n-well, p-well, diffusion, one or more polysilicon layers, any suitable number of metal layers and the associated contacts or vias that provide connections between the different layers.

When layout block 54 is complete, an initial mask layout file is generated at step 92. The mask layout file contains data regarding the geometry and interconnections of the integrated circuit represented in layout block 54. This data may be stored in the GDSII format, CIF format, DFII format, or any other suitable format for data that may describe the geometry and interconnections of integrated circuits. Similar to the schematic netlist, the mask layout file may be flat or hierarchical. In a hierarchical design, a top-level structure includes specific references to one or more levels of subcells. The references include all geometry and connectivity information that are contained within each of the subcells. Any top level structures and the associated subcells may also include local geometry and connectivity information that represent circuitry that is logically situated within the top level structure but not included in any referenced subcell.

At step 94, a placement tool analyzes the mask layout file to determine if decoupling capacitors should be added to the pattern in order to reduce fluctuations in the power supply voltage. If the placement tool determines that there is a need for decoupling capacitors, the placement tool calculates a total area in the mask layout file for placing the decoupling capacitors and identifies one or more regions in the mask layout file that may be suitable to place the decoupling capacitors at step 96. In one embodiment, the total area may be represented by a contiguous space in the mask layout file. In another embodiment, the total area may be subdivided into multiple regions that are distributed throughout the pattern. The placement tool may use any suitable Boolean operation to determine the regions of the mask layout file that may be used for the placement of decoupling capacitors.

Once a region in the mask layout file has been identified, the placement tool determines if a power supply node is located near the identified regions so that the decoupling capacitors may be connected to the appropriate power supply nodes at step 98. If the placement tool cannot locate either a local power supply node or a routing path to the power grid, the placement tool continues to analyze the mask layout file at step 96 until the placement tool finds a valid region to place the decoupling capacitors. If the placement tool locates the local power supply or the routing path to the power grid, the placement tool determines if the identified regions include features that should be relocated to a new position in order to make room for the decoupling capacitors at step 100.

If the placement tool identifies features that should be moved, the placement tool locates a new position in the mask layout file and moves the features to the new position at step 102. In one embodiment, the placement tool may determine that the feature dimensions and/or features spaces in the identified regions and any features surrounding the identified regions are greater than the minimum design rules. The placement tool may use a compaction algorithm to reduce the features (e.g., dimensions of features and spaces between features) to be approximately equal to the minimum design rules from an associated technology file. During compaction, the placement tool may invoke the DRF and LVS tools to prevent any design rule violations from being created and to maintain the correct connectivity for the moved features. The features may be moved to a different position on the same layer (e.g., a metal one feature is relocated to a new position on the metal one layer) or the features may be moved to a different layer in the mask layout file (e.g., a metal one feature is relocated to the new position in the mask layout file but on the metal two layer).

Once the features have been moved or if the placement tool determines that the identified region does not contain features that should be moved, the placement tool may add a suitable number of decoupling capacitors in the identified regions at step 104. In one embodiment, the placement tool may select a decoupling capacitor from a standard cell library that includes multiple decoupling capacitors having predetermined sizes. In another embodiment, the placement tool may size the decoupling capacitor to fit the space allocated in the identified area or create the decoupling capacitor to have any size less than the allocated space.

At step 106, the placement tool connects the decoupling capacitors to the appropriate nodes (e.g., features representing power and ground electrical connections for the integrated circuit). In one embodiment, the power and ground features may be local nodes that are located in or near the identified region and the placement tool may create an electrical connection from the decoupling capacitors to the local power and ground features. The electrical connection may be created on the same layer as the local power and ground features. For example, as illustrated in FIG. 5, VCC 68 and VSS 70 may be formed by polygons located on the metal two layer. Capacitors 72 and 74 may be formed on the diffusion layer. The placement tool may create electrical connections 76 and 78 by adding features to layout block 54 that represent the metal one contact layer, the metal one layer and the metal two contact layer. In other embodiments, the local power and ground nodes may be located on any metal layer below the top or final metal layer.

In another embodiment, the placement tool may not be able to locate any local power supply nodes in or near the identified region and the placement tool may determine a routing path to the power grid. The placement tool may create a electrical connection based on the determined routing path from the decoupling capacitor to the power grid by adding features on each of the layers between the decoupling capacitor layer and the power grid layer (e.g., the final layer of metal). When creating the electrical connection, the placement tool may move any features that may be in the same location as the electrical connection.

As illustrated in FIG. 6B, a DRC tool, which is integrated in the DRF tool, determines if there are any design rule violations in the generated mask layout file at step 108. A design rule violation may include, but is not limited to, less than minimum spacing between features on the same or different layers in layout block 54 or less than the minimum and/or maximum dimensions for the features on the various layers. The DRC tool compares the spacing between features and/or dimensions of the features in the mask layout file with the corresponding design rules for a desired manufacturing process. If a design rule violation is identified, the DRC tool includes the design rule violation in an output file at step 110. In one embodiment, the output file may be used by a CAD tool executing on computer system 30 and the violations may be displayed for a layout designer within layout block 54 on display device 36.

At step 112, a DRF tool may automatically correct the design rule violation in the mask layout file. In one embodiment, the DRF tool may move all features associated with the design rule violation in order to increase the space between the features or the dimensions of the features associated with the violation. In another embodiment, the DRF tool may move only one feature associated with the design rule violation to increase the feature dimension. In a further embodiment, the design rule violation may be caused by a feature dimension that is less than a minimum dimension in the technology file. In this example, the DRF tool may increase the feature dimension by repositioning edges of the features associated with the design rule violation.

In an additional embodiment, the DRF tool may move a feature from one layer to another layer in order to correct the design rule violation. For example, a change to a feature associated with a design rule violation may create a new design rule violation. If the features on a particular layer cannot be moved to correct the design rule violation, the DRF tool may move a feature from its original layer to a layer above or below the original layer in order to remove the design rule violation and maintain connectivity in the mask layout file. Once the design rule violation has been removed from the mask layout file, the DRF tool determines if any features should be added to electrical connections in order to maintain connectivity. The addition of new features and the increase in distance between certain features may cause the size of layout block 54 to increase. The DRF tool may also reduce the size of the mask layout file by compacting the layout so that the spacing between the features on the same or different layers is approximately equal to the minimum spacing allowed for a specific manufacturing process. Since the compaction process uses design rules from the technology file, no design rule violations are introduced into the mask layout file.

Once the design rule violations have been removed from the layout block, a clean mask layout file is generated at step 113. The clean mask layout file may be free of design rule violations and may include the minimum spacing between features and minimum widths for features for a specific semiconductor manufacturing process. The clean mask layout file is then checked by the DRF tool to verify that the design rule violations have been eliminated at step 108. In one embodiment, the DRF tool may incrementally check the spacing between features and feature dimensions in the mask layout file such that the DRF tool only checks the portions of the mask layout file that % were changed.

If no design rule violations are found, a layout versus schematic (LVS) tool is used to determine if there are any connectivity mismatches between the netlist and the mask layout file at step 114. The LVS tool compares logical connections in the netlist to their corresponding electrical connections in the mask layout file to identify any errors. If the LVS tool determines that connectivity errors are present in the mask layout file, an output file is generated that includes at least one connectivity error at step 116. In one embodiment, the CAD tool, such as a layout editor, executing on computer system 30 reads the output file and displays the connectivity errors for the layout designer within layout block 54 on display device 36.

At step 118, the connectivity errors may be removed from the mask layout file by using the output file. In one embodiment, a layout designer may manually correct the connectivity errors within layout 54 based on identifying marks provided by a layout editor. In this example, the layout designer may click on an error listed in the output file to load the error into the layout editor. In another embodiment, the LVS tool may automatically correct the connectivity errors in the mask layout file by using the output file. In this example, the LVS tool may remove all features associated with a mismatched electrical connection from the mask layout file or create a break point in the mismatched connection and remove all features associated with the mismatched connection between the break point and the mismatched node. Once the features have been removed, the LVS tool may locate the correct node in the mask layout file and determine a routing path for the matching electrical connection. The LVS tool routes the matching electrical connection in any appropriate layer (e.g., polysilicon and/or any suitable layer of metal) within the mask layout file.

Once all connectivity errors have been removed from the mask layout file, a clean mask layout file is generated at step 120. If the LVS tool determines that the mask layout file does not include any connectivity errors, a photomask data file is generated from the mask layout file at step 122. Multiple photomask data files may be generated to represent the different layers in layout block 54. For example, one photomask data file may contain information for a photomask to be used during the diffusion step of the manufacturing process and a separate photomask data file may contain information for a photomask to be used to form the polysilicon gates of an integrated circuit. At step 124, each of the photomask data files is used in a lithography system to create a photomask for each layer of an integrated circuit. At step 126, a pellicle assembly may be mounted on the photomask to create a photomask assembly. The pellicle assembly may prevent contaminants from landing on the surface of the photomask. Once the photomask assembly is created, the photomask assembly may be used in a lithography system to image the pattern from the photomask on to a semiconductor wafer at step 128. A different photomask may be used for each layer of the integrated circuit until all layers of the integrated circuit have been fabricated on a semiconductor wafer. In one embodiment, a typical integrated circuit may be fabricated by using between approximately ten and approximately thirty photomasks.

Although the present invention has been described with respect to a specific preferred embodiment thereof, various changes and modifications may be suggested to one skilled in the art and it is intended that the present invention encompass such changes and modifications fall within the scope of the appended claims.

What is claimed is:

1. A method for generating a mask layout file to reduce power supply voltage fluctuations in an integrated circuit, comprising:
    analyzing a pattern in a mask layout file to identify a region in the pattern to add one or more decoupling capacitors;
    moving a feature located in the identified region from a first position to a second position in the mask layout file to create a space in the identified region, the feature moved to the second position based on a design rule;
    automatically placing the decoupling capacitors in the space created in the identified region;
    using a design rule check tool to identify any design rule violations in the mask layout file resulting from moving the feature to create the space in the identified region and automatically placing the decoupling capacitors in the created space; and
    if one or more design rule violations are identified by the design rule check tool, using a design rule fix tool to automatically modify the mask layout file to correct the one or more identified design rule violations.

2. The method of claim 1, wherein analyzing the pattern in the mask layout file comprises determining if a routing path exists between the decoupling capacitors and a power supply feature.

3. The method of claim 2, further comprising creating an electrical connection between the decoupling capacitors and the power supply feature based on the routing path.

4. The method of claim 3, wherein the power supply feature comprises a power supply grid.

5. The method of claim 1, wherein moving the feature comprises maintaining connectivity associated with the feature.

6. The method of claim 1, further comprising the design rule operable to prevent a violation from being created when moving the feature in the identified region.

7. The method of claim 1, further comprising compacting the pattern in the mask layout file in order to move the feature.

8. The method of claim 1, wherein moving the feature comprises moving the feature from a first layer to a second layer.

9. The method of claim 1, further comprising calculating a total area in the mask layout file, the total area including a plurality of the identified regions each located at a unique position in the mask layout file.

10. The method of claim 1, further comprising sizing the decoupling capacitors to include an area of less than or approximately equal to the space.

11. The method of claim 1, further comprising selecting the decoupling capacitors from a library including a plurality of pre-sized decoupling capacitors.

12. The method of claim 1, further comprising:
generating an output file that includes positions of the decoupling capacitors in the mask layout file; and
updating a netlist to include the decoupling capacitors using the output file.

13. A computer system for generating a mask layout file to reduce power supply voltage fluctuations in an integrated circuit, comprising:
a processing resource;
a computer readable memory; and
processing instructions encoded in the computer readable memory, the processing instructions, when executed by the processing resource, operable to perform operations comprising:
analyzing a pattern in a mask layout file to identify a region in the pattern to add one or more decoupling capacitors;
moving a feature located in the identified region from a first position to a second position in the mask layout file to create a space in the identified region, the feature moved to the second position based on a design rule;
placing the decoupling capacitors in the space created in the identified region;
using a design rule check tool to identify any design rule violations in the mask layout file resulting from moving the feature to create the space in the identified region and automatically placing the decoupling capacitors in the created space; and
if one or more design rule violations are identified by the design rule check tool, using a design rule fix tool to automatically modify the mask layout file to correct the one or more identified design rule violations.

14. The system of claim 13, wherein analyzing the pattern in the mask layout file comprises determining if a routing path exists between the decoupling capacitors and a power supply feature.

15. The system of claim 14, further comprising the instructions operable to perform operations including creating an electrical connection between the decoupling capacitors and the power supply feature based on the routing path.

16. The system of claim 13, wherein moving the feature comprises maintaining connectivity associated with the feature.

17. The system of claim 13, further comprising the design rule operable to prevent a violation from being created when moving the feature in the identified region.

18. The system of claim 13, further comprising the instructions operable to perform operations including compacting the pattern in the mask layout file in order to move the feature.

19. The system of claim 13, further comprising the instructions operable to perform operations including sizing the decoupling capacitors to include an area of less than or approximately equal to the space.

20. Software for generating a mask layout file to reduce power supply voltage fluctuations in an integrated circuit, the software being embodied in computer-readable media and when executed operable to:
analyze a pattern in a mask layout file to identify a region in the pattern to add one or more decoupling capacitors;
move a feature located in the identified region from a first position to a second position in the mask layout file to create a space in the identified region, the feature moved to the second position based on a design rule; and
place the decoupling capacitors in the space created in the identified region;
use a design rule check tool to identify any design rule violations in the mask layout file resulting from moving the feature to create the space in the identified region and placing the decoupling capacitors in the created space; and
if one or more design rule violations are identified by the design rule check tool, use a design rule fix tool to modify the mask layout file to correct the one or more identified design rule violations.

21. The software of claim 20, further operable to:
determine if a routing path exists between the decoupling capacitors and a power supply feature; and
create an electrical connection between the decoupling capacitors and the power supply feature based on the routing path.

22. The software of claim 20, further operable to maintain connectivity associated with the feature when the feature is moved.

23. The software of claim 20, further comprising the design rule operable to prevent a violation from being created when moving the feature in the identified region.

24. The software of claim 20, further operable to compact the pattern in the mask layout file in order to move the feature.

25. The software of claim 20, further comprising the second position located outside of the identified region.

26. The software of claim 20, further comprising the second position located inside the identified region.

* * * * *